United States Patent
Wei et al.

(10) Patent No.: US 6,704,667 B2
(45) Date of Patent: Mar. 9, 2004

(54) REAL TIME MASS FLOW CONTROL SYSTEM WITH INTERLOCK

(75) Inventors: Lee Chien Wei, Hsin-Chu (TW); Jao Kuo Cheng, Hsin-Chu (TW); Lee Hsi Lung, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/144,520

(22) Filed: May 13, 2002

(65) Prior Publication Data
US 2003/0212507 A1 Nov. 13, 2003

(51) Int. Cl.$^7$ ................................................. G01F 1/00
(52) U.S. Cl. .......................................... 702/45; 700/266
(58) Field of Search ........................... 96/108, 112, 157, 96/206; 73/195, 196, 200, 861; 137/2, 240, 486, 487.5, 557, 597, 602, 606, 614.2, 624.12, 884; 222/3; 251/63.5, 129.4, 326; 279/128; 118/707, 715; 438/935; 700/266; 702/45, 33

(56) References Cited

U.S. PATENT DOCUMENTS

| | | | | |
|---|---|---|---|---|
| 5,339,237 A | * | 8/1994 | Mody et al. | 700/79 |
| 5,516,366 A | * | 5/1996 | Kanno et al. | 118/715 |
| 6,363,958 B1 | * | 4/2002 | Ollivier | 137/2 |
| 6,450,200 B1 | * | 9/2002 | Ollivier | 137/624.12 |
| 6,500,263 B2 | * | 12/2002 | Chang et al. | 118/715 |
| 6,539,968 B1 | * | 4/2003 | White et al. | 137/10 |

* cited by examiner

*Primary Examiner*—John Barlow
*Assistant Examiner*—Douglas Washburn
(74) *Attorney, Agent, or Firm*—Tung & Associates

(57) ABSTRACT

An interlock controller provides real time monitoring of the flow of gases or fluids into a semiconductor processing chamber and interrupts the flow when the peak flow exceeds a predetermined level. The controller receives signals from a mass flow control valve, respectively representing a commanded flow rate and an actual flow rate. The difference between these two signals is calculated and if the difference exceeds a certain value, a measurement cycle is initiated during which the peak flow rate is measured. If the measured peak low rate is greater than a predetermined value, then the controller closes a shut off vale to interrupt the flow into the chamber.

19 Claims, 3 Drawing Sheets

REAL TIME MASS FLOW CONTROL SYSTEM WITH INTERLOCK

TECHNICAL FIELD

The present invention broadly relates to semiconductor processing equipment, and deals more particularly with an interlock system for controlling the flow of gas or other fluid mediums into a processing chamber.

BACKGROUND OF THE INVENTION

Manufacturing processes for producing semiconductor devices employ a variety of techniques and processes that require the use of reactive gasses combined in precise amounts or ratios. For example, one such process is chemical vapor deposition (CVD) which involves the growth of thin films wherein very high quality films are deposited onto a heated substrate. CVD processes are widely used for forming various layers during integrated circuit fabrication. CVD processes generally involve a decomposition of a precursor gas mixture, at the surface of the heated substrate, to form components which are the chemical precursors of the desired film composition. The CVD process is carried out in a sealed chamber which is evacuated before the selective introduction of reactive gasses. These reactive gases are typically introduced in a serial manner to effect successive process steps. Typically, the reactive gases are delivered to the chamber from individual sources through a series of conduits and valves. In many cases, a combination of gases and/or liquids are introduced into the chamber during a particular process step. In other cases, only a single gas or liquid is introduced into the chamber during a particular process step. In any event, it is often critical that the precise amounts of the gas or liquid be introduced into the chamber so that carefully matched ratios of gases/liquids are maintained, otherwise the desired process results are not achieved, and in some cases, the introduction of different gases outside established ratios may result in a highly volatile, and possibly explosive mixture. Among the liquid chemicals that are critical to introduce in precise amounts are TEPO, TEB and TEOS. Similarly, improper match ratios of boron, phosphine, TEOS, may form BEPSG film side-etch of wafers, thereby resulting in scrap.

A variety of flow control devices have been created to assist in carefully controlling the flow of gases and liquids into the processing chamber, but even these devices are subject to error. For example, mass flow controllers (MFCs) are frequently connected between an incoming source of gas or liquid and the chamber in order to precisely control flow, thus permitting careful ratio matching of the various liquid or gas chemicals used to carry out a particular processing step. One of the problems creating errors where MFC's are used results from the fact that there is some degree of electrical "overshoot" of the valve control signal when the mass flow control valve is initially opened to introduce a new chemical into the chamber. This overshoot is an electrical phenomena in which the control signal commanding the valve to open overshoots its normal value. However, since the MFC is a proportional control device, the electrical overshoot manifests itself in a proportionate flow overshoot passing through the valve, thus allowing a greater than desired amount of the gas or liquid to be introduced into the chamber. Existing protective devices are limited to sensing catastrophic failures or malfunctions of MFC's and similar valves. For example, existing protective devices monitor the actual flow rate into the chamber and compare it to a set flow rate over a fairly long length of time during the process step. If the flow rate exceeds the set point for this prolonged period it is assumed that the valve has malfunctioned and the processing operation is shut down. Such protective devices do not, however sense transient overshoot phenomena which prevent precise matching of the ratios of chemicals introduced into the chamber. In other words, the prior art protective devices are not capable of detecting real time flow spikes during a processing operation. The present invention is directed toward solving this problem.

SUMMARY OF THE INVENTION

According to one aspect of the invention, a system is provided for controlling the flow of a fluid medium such as a gas or liquid, into a process chamber used to manufacture semiconductor devices. The system includes a mass flow control valve, means for producing first and second signals respectively representing a commanded flow rate and the actual flow rate through the valve. The system further includes a shut off valve for interrupting the flow of fluid into the chamber, and an interlock controller for controlling this shutoff valve. The interlock controller measures the difference between the first and second signals and when this difference is greater that a first pre-selected value, a measurement cycle is commenced in which the peak value of the signal representing the actual flow is recorded. When the peak value the exceeds a pre-selected value, the controller issues a signal that closes the shutoff valve, thereby interrupting the flow of the fluid into the chamber.

According to another aspect of the invention, a method is provided for controlling the introduction of a flowable medium into a processing chamber used to manufacture semiconductor wafers. The method broadly includes the steps of controlling the rate of flow of the medium into the chamber using a flow control valve; measuring the magnitude of the first electrical signal used to control the valve and representing a commanded rate of flow; measuring the magnitude of the second electrical signal representing the actual rate of flow through the valve; determining the difference in value between the first and second signals; commencing a measurement cycle where the difference exceeds a predetermined value; measuring the peak value of the second signal during the measurement cycle; and, interrupting the flow of the medium into the chamber when the measured peak value exceeds a predetermined value. In a preferred form, the signal comparison is delayed a predetermined length of time after the flow control valve is initially opened.

Accordingly, it is the primary object of the intention to provide an interlock control system for semiconductor manufacturing processes which precisely controls the flow of a fluid medium into a processing chamber.

Another object of the intention is to provide an interlocking control system as described above which allows precise matching of the ratios of the multiple chemicals introduced into the processing chamber.

A still further object of the invention is to provide an interlock control system of the type mentioned above which allows real time monitoring of flow spikes so that immediate intervention can be effected to correct or stop a process step.

A still further object of the invention is to provide an interlock control system of the type mentioned which eliminates the possibility of potentially explosive mixtures of gases from forming in the processing chamber.

Another object of the invention is to provide an interlock control system as described above which allows real time monitoring and control of the flow rates in a manner which results in improved processing performance and reduced material scrap.

These, and further objects and advantages of the invention will be made clear or will become apparent during the following description of a preferred embodiment of the invention.

BRIEF DESCRIPTION OF THE DRAWINGS

In the drawings which form an integral part of the specification and are to be read in conjunction therewith, and in which like reference numerals are employed to designate identical components in the various views.

DESCRIPTION OF THE PREFERRED EMBODIMENTS

Figure 1:
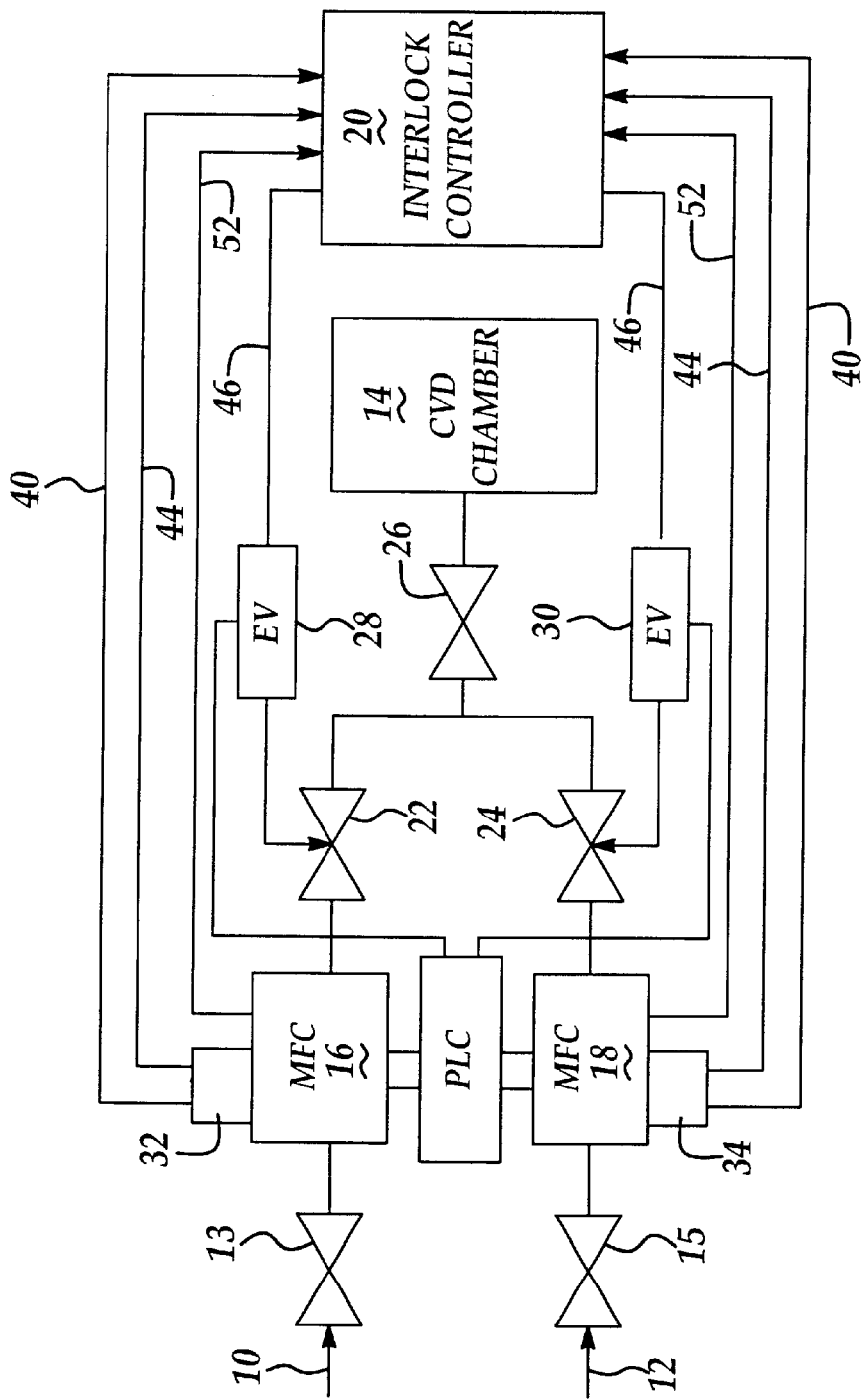
FIG. 1 is a combined block and schematic diagram of a semiconductor processing system employing the interlock controller of the present invention.

Referring first to FIG. 1, the present invention broadly relates to a real time mass flow control system for precisely controlling the flow, and thus the amounts of gases and/or liquids into a process chamber, such as CVD chamber 14 wherein well-known processes are conducted to manufacture semiconductor devices. In the case of CVD processing, those skilled in the art will recognize that a variety of liquid and gaseous chemicals are combined in the chamber 14, in carefully matched ratios to produce chemical reactions on the surface of the substrate (not shown) being processed. As used herein, the terms fluid, fluid medium or flowable medium mean either a liquid or gas.

In the illustrated embodiment, two differing fluids are delivered from corresponding sources 10, 12 through manually or automatically operated control valves 13, 15 to corresponding mass flow controllers (MFCs) 16, 18. The MFCs 16, 18 are conventional, well known devices that are employed to provide accurately repeatable, regulated flow of gas or liquid there through. Each of the MFCs 16, 18 typically consists of three components: a mass flow rate sensor which can be one of a variety of types including thermal or pressure based; a mass flow rate metering valve which can be actuated by one of a variety of actuator types including solenoids, voice coil or piezo; and, a controller which closes the loop by receiving a set point and driving the actuators such that the mass flow rate is controlled to the set point. The set points for the MFCs 16, 18 is derived from a master controller, such as the PLC (programmable logic controller) 17 which is responsible for controlling overall operations and their sequences.

The MFCs 16, 18 respectively include a pair of connectors 32, 34 which output corresponding set point signals and actual flow rate value signals on lines 40, 44, which are received as inputs to an interlock controller 20. The set point position signals on lines 40 represent the desired set points of the MFCs 16, 18, as dictated by the PLC 17. The signals on lines 44 represents the actual, measured rate of fluid flow through the corresponding MFCs 16, 18. The fluids passing through the MFCS 16, 18 are respectively delivered through automatically controlled valves 22, 24, and are then combined to pass through a further valve 26 before being introduced into the chamber 14. Valves 22 24 are respectively controlled by a pair of electro-magnetically operated valves 28, 30 which are in turn normally controlled by the PLC 17. However, as will become later apparent, valves 28, 30, which act as shut off valves, can be operated by signals output on lines 46 from the interlock controller 20. As will be later described, the interlock controller 20 monitors the signals on lines 40 and 44 and functions to measure the peak value of the flow rate through MFC's 16, 18 during certain measuring cycles, on a real time basis. During a measuring cycle, in the event that the measured peak flow rate exceeds a pre-selected value, as may occur during an overshoot condition, the interlock controller 20 issues signals on lines 46 to the valves 28 which in turn are actuated to close the valves 22, 24, thus terminating the flow of fluids into the chamber.

Figure 2:
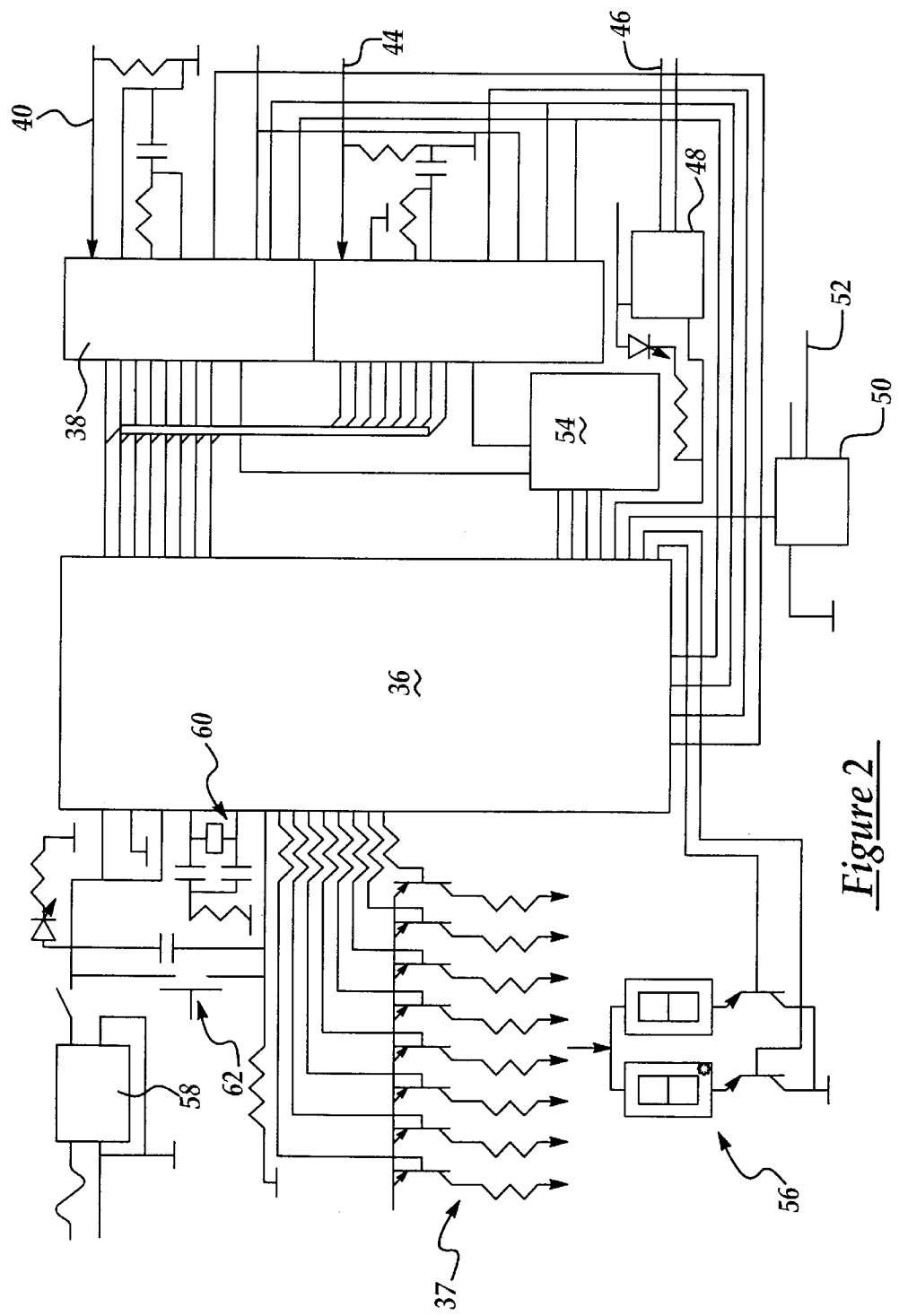
FIG. 2 is a combined block and detailed schematic diagram of the interlock controller shown in FIG. 1; and, FIG. 3 is a flow chart of a program for controlling the operation of the interlock controller.

Reference is now made to FIG. 2 wherein further details of the interlock controller 20 are depicted. The heart of the interlock controller 20 is a low power, high performance microcomputer 36 containing its own memory, wherein a set of programmed instructions are stored for operating the controller. The microcomputer 36 may comprise, for example, a device manufactured by the Atmel Co. and designated by the manufacturer's model number AT89C51. The AT89C51 includes flash memory, RAM, 32 I/O lines, 2–16 bit timers/counters, a 5 vector 2 level architecture, a full duplex serial port, on chip oscillator and clock circuitry. The microcomputer 36 is powered from a 5 volt converter 58 which converts a 24 volt power supply source into 5 volts which is connected with the power pins of the microcomputer 36. A reset switch 62 is provided, as well as an external crystal oscillator 60. A series of drivers connected with output pins of the microcomputer 36 are employed to drive a visual display 56 which displays the value of the peak voltage recorded by microcomputer 36. Incoming analog signals are converted into digital form before delivery to the microcomputer 36 by means of an A-to-D converter 38 which may comprise, for example, in an ADC0804 chip manufactured by National Semiconductor. The signals on lines and 44 respectively representing the actual measured gas flow rate, and the set point for each of the MFCs 16, 18, are converted into digital form and delivered to one set of input pins of the microcomputer 36. Certain of the signals output by the converter 38 are decoded by a decoder 54 before delivery to the microcomputer 36.

Each of the MFCs 16, 18 includes a relay 50 associated therewith, which controls opening and closing of the associated MFC 16, 18. A signal derived from the relay 50 is input to the microcomputer 36, thereby providing an indication of whether an MFC 16, 18 has been opened. When the microcomputer 36 determines that the measured peak voltage representing the actual flow rate through the MFCs 16, 18 exceeds a predetermined value and that possible voltage overshoot has occurred, a control signal is delivered to a relay 48 which in turn results in the issuance of an interlock control signal on line 46. As previously described, the interlock signals on lines 46 actuates valves 28, 30 which in turn close valves 22,24 in order to cut off the flow of fluid to the chamber 14.

Figure 3:
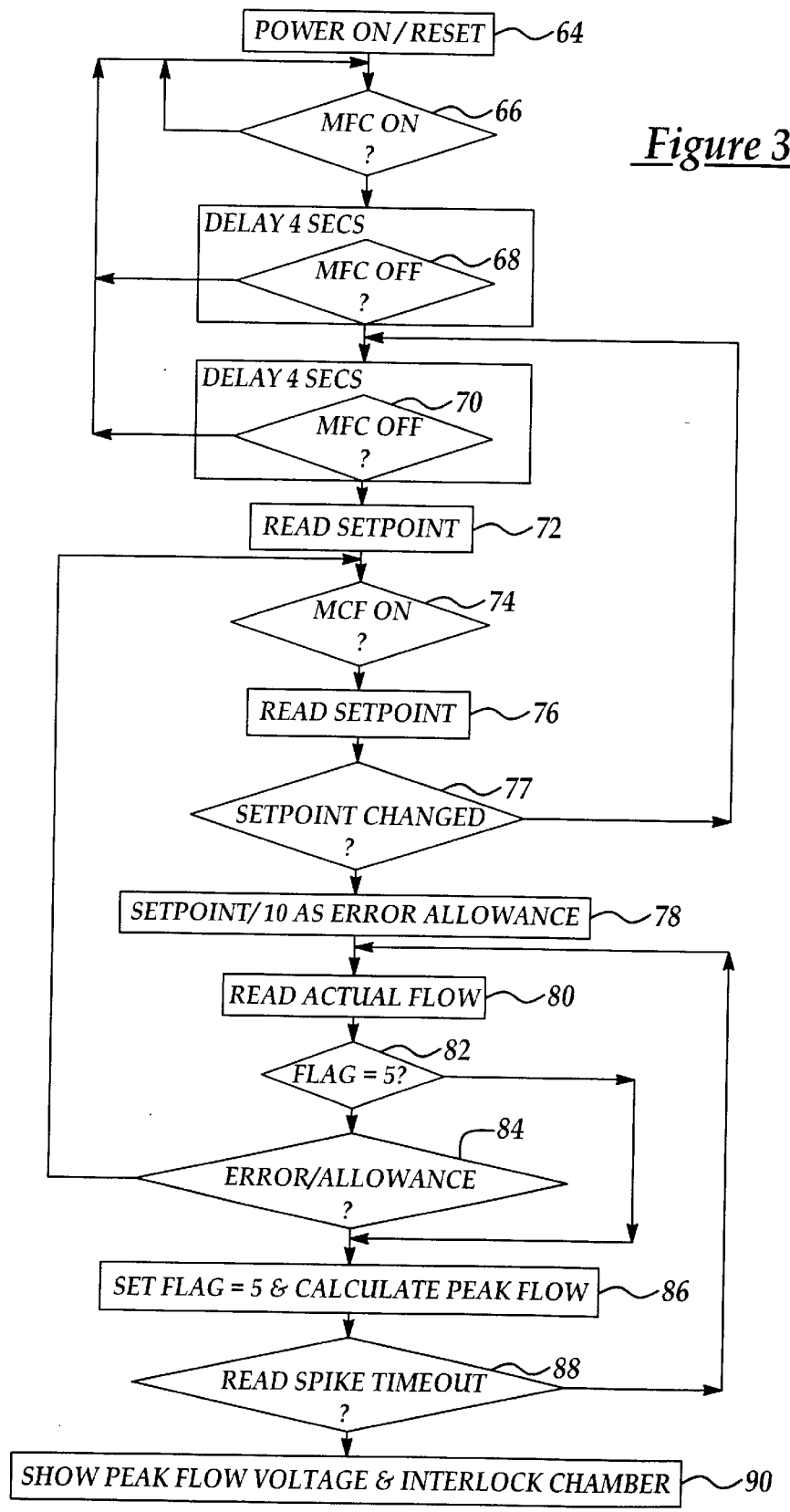

Referring now also to FIG. 3, the interlock controller 20 is initially turned on (or reset through the reset switch 62) at 64. The program checks to see whether the monitored MFC 16, 18 is on at steps 66. If the MFC is on, the program delays for four seconds before checking further, as shown at step 68. If the MFC is determined to be off after this four second delay, the program returns to step 66, otherwise it progresses to step 70 where a further delay check is performed. If the MFC is determined to be on at the end of step 70, the value of the set point signal on line 44 is read, as shown in step 72, following which a further check is made at step 74 to determine whether the MFC is still on. If so, the set point is read a second time at step 66 and a determination is made at step 77 as to whether this set point in is changed. If there has been a change in the set point, the program repeats itself beginning at step 70, otherwise the program progresses to step 78 where the set point value is reduced by a predetermined factor, as error allowance. Next, at step 80, the microcomputer 36 reads the value of the actual gas flow rate signal present on line 40. At step 82, the difference is calculated between the set point read at step 76 and the flow rate measured at step 80. If this difference is above a pre-selected value, then the program skips to step 86, otherwise a determination is made at step 84 as to whether or not the difference is greater a second pre-selected value. If the error is greater than the pre-selected value, then a determination is made of the peak flow rate at step 86 which is continued for a pre-selected period of time, for example, a period of three seconds. The program continues calculating the peak flow over this time period, and after this period times out, the program proceeds to step 90 at which point the peak flow voltage is output for display on display 56 and the interlock chamber signal is issued on line 46 to shut down the system.

From the foregoing, it is apparent that the real time mass flow control system with interlock described above not only provides for the reliable accomplishment of the objects of the invention, but does so in a particularly effective and economic manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A system for controlling the flow of a fluid medium into a process chamber used to manufacture semiconductor devices, comprising:
   at least one mass flow control valve for controlling the flow of said fluid medium therethrough;
   a master controller for controlling the operation of said mass flow control valve and said chamber, and for producing a first signal representing a commanded flow rate through said mass flow control valve;
   said mass flow control valve including a sensor for producing a second signal representing the actual rate of flow of said medium through said valve;
   at least one shut off valve normally controlled by said master controller through which said medium flows into said chamber;
   an interlock controller connected with said shut off valve for measuring the peak value of said second signal during a measurement cycle, and for closing said shut off valve during said measurement cycle when said peak value exceeds said commanded flow rate by a preselected value.

2. The system of claim 1, wherein said control valve includes a connector and said controller receives said first and second signals from said connector.

3. The system of claim 1, wherein said shut off valve is connected between said control valve and said chamber.

4. The system of claim 1, wherein said controller includes a set of programmed instructions for performing a set of calculations to determine said difference.

5. The system of claim 1, wherein said controller includes means for displaying said peak value.

6. A system for controlling the flow of a fluid medium into a process chamber used to manufacture semiconductor devices, comprising:
   at least one mass flow control valve for controlling the flow of said fluid medium therethrough;
   a master controller for controlling the operation of said mass flow control valve and said chamber, and for producing a first signal representing a commanded flow rate through said valve;
   means for producing a second signal representing the actual rate of flow of said medium through said valve;
   means normally operated by said master controller for interrupting the flow of said fluid medium into said chamber;
   an interlock controller for measuring the peak value of said second signal during a measurement cycle and for activating said interrupting means to interrupt said flow into said chamber during said measurement cycle when said peak value exceeds a pre-selected value.

7. The system of claim 6, wherein said control valve includes a connector and said interlock controller receives said first and second signals from said connector.

8. The system of claim 6, wherein said interrupting means includes a shut off valve, and said shut off valve is connected between said control valve and said chamber.

9. The system of claim 6, wherein said interlock controller includes a set of programmed instructions for determining the difference in magnitude between said first and second signals.

10. A method for controlling the introduction of a flowable medium into a processing chamber used to manufacture semiconductor devices, comprising the steps of:
    (A) controlling the rate of flow of said medium into said chamber using a flow control valve;
    (B) measuring the magnitude of a first electrical signal used to control said valve and representing a commanded rate of flow;
    (C) measuring the magnitude of a second electrical signal representing the actual rate of flow through said valve;
    (D) determining the difference in value between said first and second signals;
    (E) commencing a measurement cycle when the difference determined in step (D) exceeds a predetermined value;
    (F) measuring the peak value of said second signal during said measurement cycle;
    (G) interrupting the flow of said medium into said chamber during said measurement cycle when the peak value measured in step (F) exceeds a predetermined value.

11. The method of claim 10, including the step of producing an electrical signal indicating the start of flow through said flow control valve.

12. The method of claim 11, including the step of, after start signal is produced, delaying the commencement of steps (B) and (C) for a predetermined length of time.

13. The method of claim 10, wherein step (G) is performed only when said difference is greater than 10%.

14. The method of claim 10, including the step of visually displaying said peak value.

15. The method of claim 10, wherein said measurement cycle is approximately 3 seconds in duration.

16. The method of claim 10, wherein step (G) includes closing a shut off valve to terminate the flow of said medium into said chamber.

17. The method of claim 16, wherein step (G) includes issuing a trip signal, actuating a relay using said trip signal, and producing a control signal in response to the closure of said relay, and using said control signal to close said shut off valve.

18. A method for controlling the introduction of a flowable medium into a processing chamber used to manufacture semiconductor devices, comprising the steps of:
(A) controlling the rate of flow of said medium into said chamber using a flow control valve;
(B) measuring the magnitude of a first electrical signal used to control said valve and representing a commanded rate of flow;
(C) measuring the magnitude of a second electrical signal representing the actual rate of flow through said valve;
(D) determining the difference in value between said first and second signals;
(E) commencing a measurement cycle when the difference determined in step (D) is greater than 10%;
(F) measuring the peak value of said second signal during said measurement cycle;
(G) interrupting the flow of said medium into said chamber when the peak value measured in step (F) exceeds a predetermined value.

19. A method for controlling the introduction of a flowable medium into a processing chamber used to manufacture semiconductor devices, comprising the steps of:
(A) controlling the rate of flow of said medium into said chamber using a flow control valve;
(B) measuring the magnitude of a first electrical signal used to control said valve and representing a commanded rate of flow;
(C) measuring the magnitude of a second electrical signal representing the actual rate of flow through said valve for approximately 3 seconds;
(D) determining the difference in value between said first and second signals;
(E) commencing a measurement cycle when the difference determined in step (D) exceeds a predetermined value;
(F) measuring the peak value of said second signal during said measurement cycle;
(G) interrupting the flow of said medium into said chamber when the peak value measured in step (F) exceeds a predetermined value.

* * * * *